United States Patent
Chen (10) Patent No.: US 9,780,793 B2
(45) Date of Patent: Oct. 3, 2017

(54) METHODS AND APPARATUSES FOR OFFSETTING AGING IN PASS TRANSISTORS

(71) Applicant: ALTERA CORPORATION, San Jose, CA (US)

(72) Inventor: Christopher Sun Young Chen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/989,549

(22) Filed: Jan. 6, 2016

(65) Prior Publication Data
US 2017/0194964 A1  Jul. 6, 2017

(51) Int. Cl.
H03K 19/177 (2006.01)
H03K 19/0185 (2006.01)

(52) U.S. Cl.
CPC . H03K 19/1774 (2013.01); H03K 19/018585 (2013.01); H03K 19/1776 (2013.01)

(58) Field of Classification Search
None
See application file for complete search history.

(56) References Cited

U.S. PATENT DOCUMENTS

| | | | |
|---|---|---|---|
| 6,933,869 B1 | 8/2005 | Starr et al. | |
| 7,268,575 B1 * | 9/2007 | Chen | G01R 31/2642 324/762.09 |
| 7,689,377 B2 | 3/2010 | Jain et al. | |
| 9,058,436 B1 | 6/2015 | Chiu et al. | |
| 2004/0130957 A1 | 7/2004 | LaRosa et al. | |
| 2006/0132176 A1 | 6/2006 | Lewis | |
| 2014/0312873 A1 | 10/2014 | Raja et al. | |
| 2015/0109046 A1 * | 4/2015 | Fukuo | H03K 17/284 327/398 |
| 2015/0277393 A1 | 10/2015 | Liu et al. | |
| 2015/0333754 A1 * | 11/2015 | Sofer | H03K 19/0944 327/513 |

OTHER PUBLICATIONS

S. Ramey et al., "Frequency and Recovery Effects in High-κ BTI Degradation," IEEE 47th Annual International Reliability Physics Symposium, Montreal, 2009, pp. 1023-1027.

J. Mitard et al., "Large-Scale Time Characterization and Analysis of PBTI in HfO2/Metal Gate Stacks," IEEE 44th Annual International Reliability Physics Symposium, San Jose, 2006, pp. 174-178.

X. Garros et al., "PBTI Mechanisms in La Containing Hf-based Oxides Assessed by Very Fast IV Measurements," IEEE International Electron Devices Meeting, 2010, pp. 4.6.1-4.6.4.

(Continued)

*Primary Examiner* — Douglas W Owens
*Assistant Examiner* — James H Cho (57) ABSTRACT

Transistors degrade when subjected to voltage stress. Methods are described for reducing this aging problem by applying a reverse voltage to the gates of the circuit on an intermittent or periodic basis. By applying such a voltage for a brief period of time such as one second, the aging process is essentially nullified.

20 Claims, 5 Drawing Sheets

(56) References Cited

OTHER PUBLICATIONS

S. Kalpat et al., "BTI Characteristics and Mechanisms of Metal Gated HfO2 Films With Enhanced Interface/Bulk Process Treatments," IEEE Transactions on Device and Materials Reliability, vol. 5, No. 1, Mar. 2005, pp. 26-35.
B. Kaczer et al., "Maximizing Reliable Performance of Advanced CMOS Circuits—A Case Study," 2014 IEEE International Reliability Physics Symposium, 2014, pp. 4.1-4.6.
T. Grasser, "Fundamentals of RTN, BTI, and Hot Carrier Degradation: A Matter of Timescales," 2013 IEEE International Reliability Physics Symposium, Sunday Tutorial 1.3.
Korean Intellectual Property Office, International Search Report for International application No. PCT/US2017/012211.
Korean Intellectual Property Office, International Written Opinion of the ISA for International application No. PCT/US2017/012211.

* cited by examiner

METHODS AND APPARATUSES FOR OFFSETTING AGING IN PASS TRANSISTORS

BACKGROUND

Transistors degrade when subjected to voltage stress. In particular, bias temperature instability (BTI) causes threshold voltage degradation over time. Charges are trapped in the transistor gate oxide which causes the threshold voltage to increase in the case of a NMOS transistor. It is known that the aging process may be reversed by applying a voltage of opposite polarity to the gate of the transistor for a short period of time. This voltage releases the charges stored in the gate oxide and causes the threshold voltage to return to approximately its initial value.

The aging problem is especially acute with transistors that are used under the same voltage conditions for extended periods of time. One such use is in the routing circuits of a field programmable gate array (FPGA). The function of the FPGA is specified by the bits of a configuration random access memory (CRAM) that control circuits such as the routing circuits. A single CRAM configuration often is used for the entire life of the device in which the FPGA is connected. This can be many years.

Figure 1:
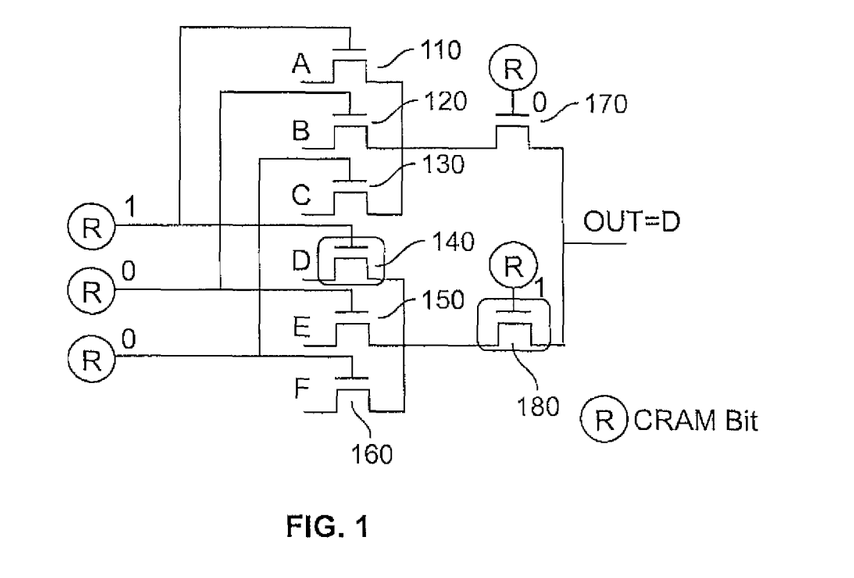
FIG. 1 is a schematic diagram of a typical pass transistor routing circuit that is controlled by a configuration random access memory (CRAM)

FIG. 1 illustrates a typical routing circuit 100. Circuit 100 comprises eight NMOS pass gate transistors 110, 120, 130, 140, 150, 160, 170, 180. Each transistor includes a source, a drain and a gate. Transistors 110-160 provide inputs A, B, C, D, E, F to circuit 100 and transistors 170, 180 provide outputs. Three configuration bits R are applied to the gates of transistors 110-160 to control whether the transistors are conducting (ON) or not conducting (OFF). A high bit (often represented as a +1) turns the NMOS transistor ON and holds it in that state; and a low bit (often represented as a 0) turns the transistor OFF and holds it in that state. The magnitude of the voltage of a high bit depends on the semiconductor technology in which the transistor is fabricated; and in the most advanced technologies of today may be approximately one volt. The magnitude of the voltage of a low bit is typically zero volts.

Two additional configuration bits R are applied to the gates of transistors 170 and 180 to control whether those transistors are ON or OFF. For example, if the R bits applied to the gates of transistors 140 and 180 are each a 1 and the other bits are zeroes, the output of circuit 100 is D.

Similar circuits of PMOS pass gate transistors will also be familiar to those skilled in the art. In the case of PMOS transistors, a high bit that turns the transistor ON is often represented by a −1 and a low bit by a 0.

It must be emphasized that circuit 100 is only illustrative of many circuits that are configured by control bits that are applied to the gates of pass transistors in the circuit. In many cases, it is expected that the control bits will continue to be applied to the gates for extended periods of time such as many years since the control bits specify the functionality of the circuit in which the FPGA is located.

In anticipation of aging, configuration circuits such as circuit 100 are typically designed with sufficient margins on operating voltages, speed and size that the circuit will perform satisfactorily for many years. These margins, however, impose substantial costs on the circuit in terms of its performance, power requirements and cost of manufacture.

SUMMARY

The present invention alleviates some of these problems. The aging problem is reduced by applying a reverse voltage to the gates of the circuit on an intermittent or periodic basis. By applying such a voltage for a brief period of time, the aging process is essentially nullified.

BRIEF DESCRIPTION OF DRAWING

These and other objects, features and advantages of the invention will be more readily apparent from the following Detailed Description in which.

DETAILED DESCRIPTION

Figure 2:
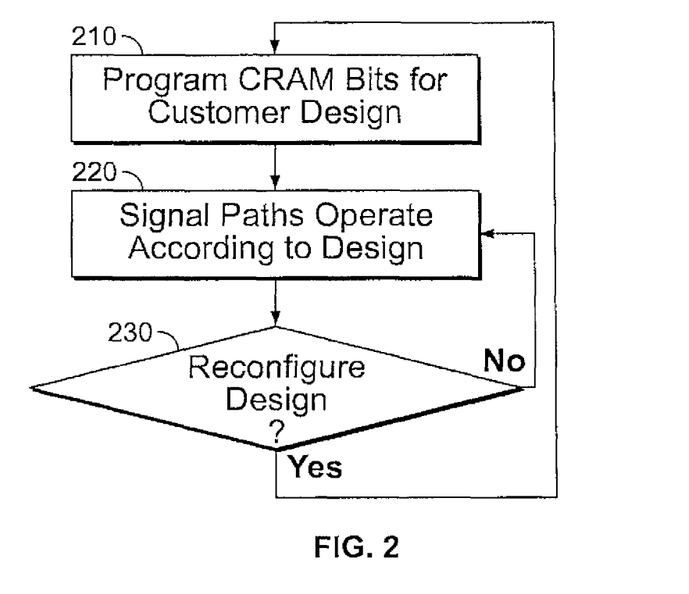
FIG. 2 is a flow chart depicting conventional operation of a CRAM.

FIG. 2 is a flowchart depicting conventional operation of a CRAM. At step 210, configuration bits are programmed into a configuration memory (CRAM). The configuration bits that are "1s" apply a positive voltage to the gates of NMOS transistors in the circuits controlled by the CRAM. Among those circuits are routing circuits of pass transistors such as circuit 100. Numerous other circuits of pass transistors are available having gates that may also be controlled by the configuration bits of a CRAM.

The configuration bits establish a specific circuit that may then be used at step 220 unchanged in that form for the life of the circuit. This lifetime may be many years. The configuration bits can be reprogrammed as indicated at step 230; and if the user of the CRAM decides to do so, a new pattern of configuration bits may be programmed into the CRAM by repeating step 210. Illustratively, the need to reprogram the CRAM is determined by detecting a reprogramming instruction.

During the lifetime of the CRAM and the transistors that it controls, the performance of the transistors will degrade. This degradation is anticipated and typically is compensated for by providing significant margins in the operating performance such as voltage and speed of the transistors and in their physical size. It is desirable to reduce some of these margins.

Figure 3:
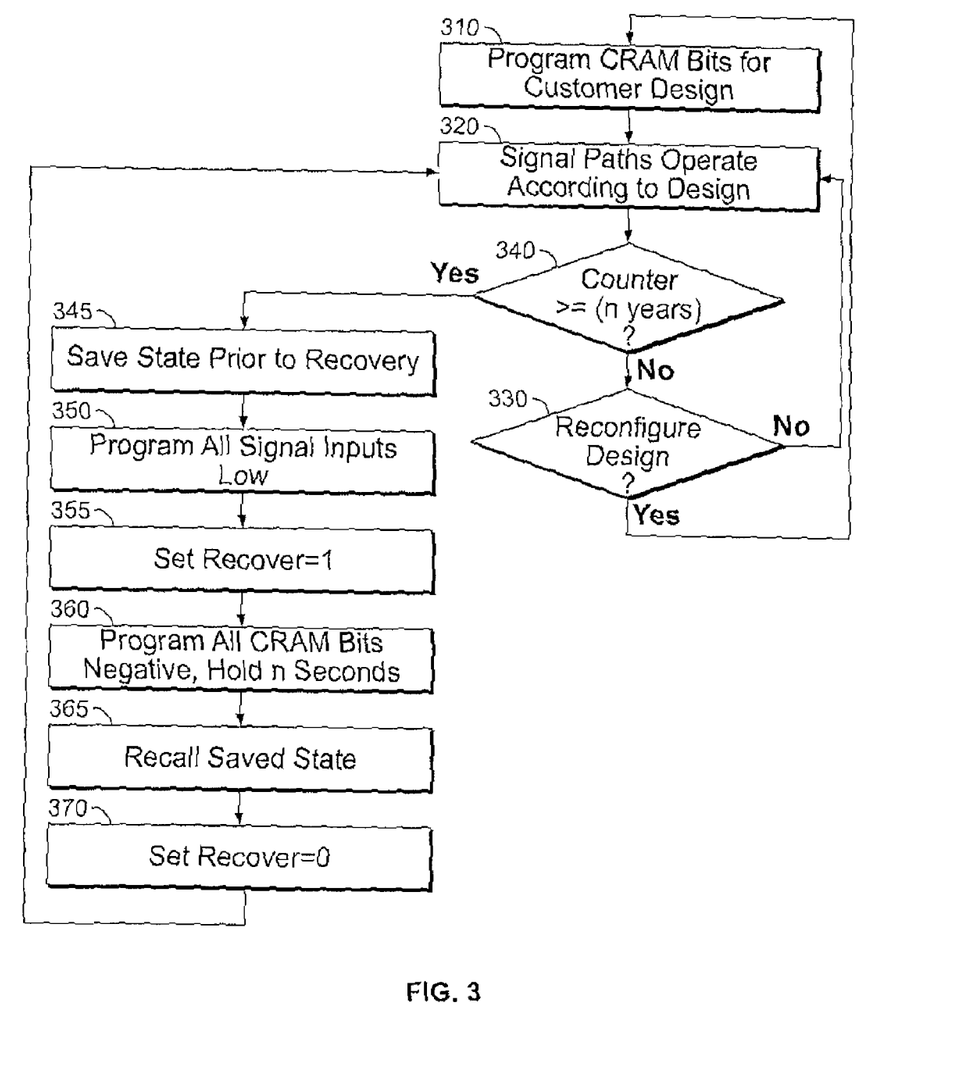
FIG. 3 is a flow chart of a first illustrative embodiment of the invention.

FIG. 3 is a flowchart of an illustrative method for practicing the invention. The method begins at step 310 with the programming of configuration bits in a configuration memory (CRAM). The configuration bits that are "1s" apply a positive voltage to the gates of NMOS transistors in the circuits controlled by the CRAM. Among those circuits are routing circuits of pass transistors such as circuit 100. Numerous other circuits of pass transistors are available having gates that may also be controlled by the configuration bits of a CRAM.

The configuration bits establish a specific circuit which may then be used at step 320 unchanged in that form for an extended time. The configuration bits can be reprogrammed as indicated by step 330. In accordance with the invention, on a periodic basis which typically is from a few months to a few years, the aging process is reversed and the configuration bits are reset. To do this, the CRAM is monitored at step 340 to determine if the time elapsed from the last setting of the configuration bits has reached a predetermined duration. When this duration is reached, the state of the configuration memory is stored at step 345; and the signal inputs to the transistors controlled by the bits of the CRAM are programmed low at step 350. One or more control bits such as Recover and EN_VSSR are set high at step 355. The gates of the transistors controlled by the configuration memory are then subjected at step 360 to a rejuvenating process. In this process, voltages are applied to all the gates of the pass transistors that are opposite in polarity to the high voltages of the configuration bits applied in step 320 and at approximately the same magnitude. These voltages are applied for a duration of at least one second and typically for several seconds which has been found to be sufficient to restore at least 80 percent or more of the original operating characteristics of the pass transistors.

After completion of the rejuvenating process, the configuration bits that were stored are then used at step 365 to reconfigure the configuration memory with the same bit pattern that was used in step 310 to configure the memory. The control bits Recover and EN_VSSR are then reset to zero at step 370; and the process then returns to step 320 and resumes monitoring the CRAM at step 340 to determine if the time elapsed from the last setting of the configuration bits has reached a predetermined duration.

Figure 4:
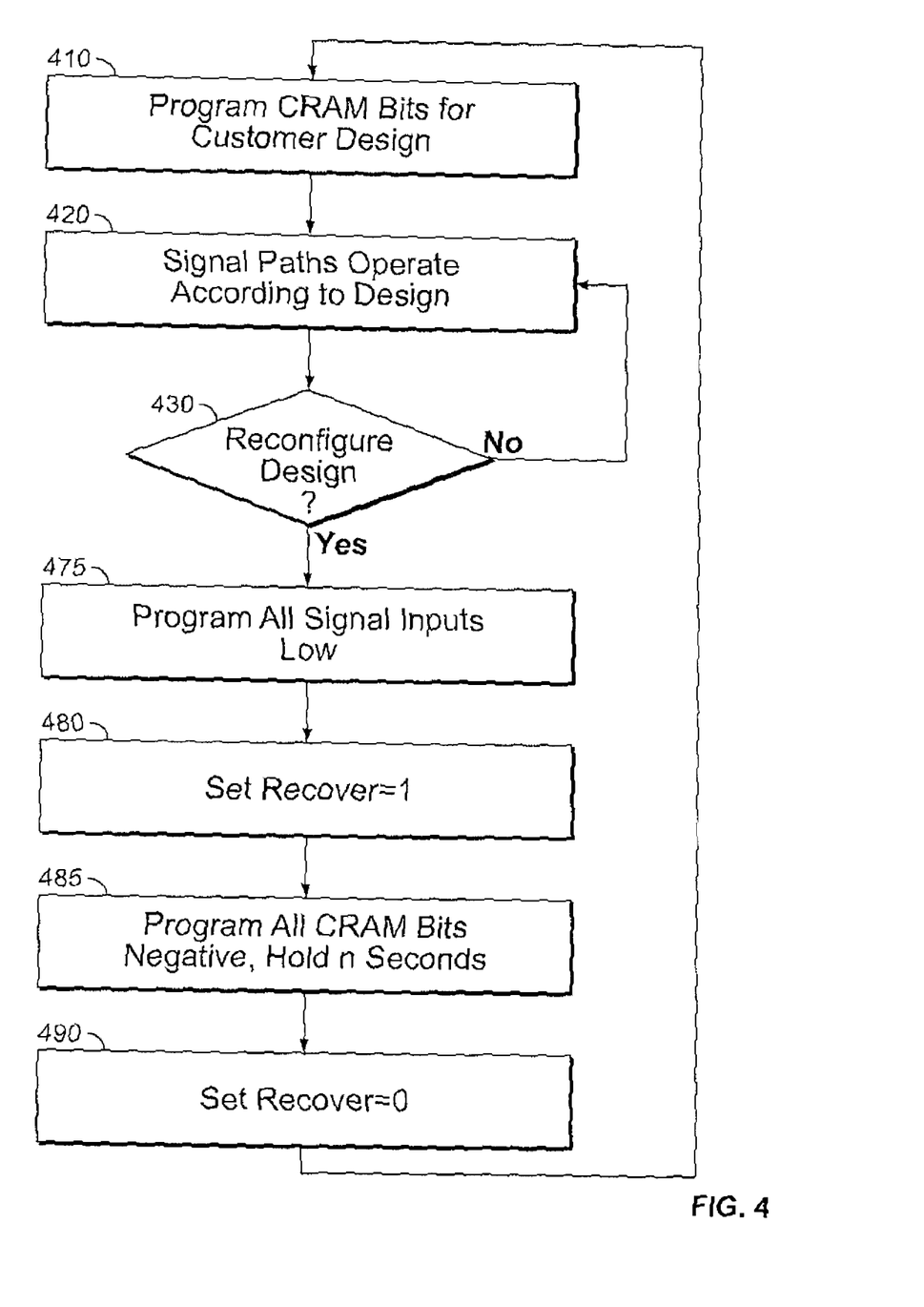
FIG. 4 is a flow chart of a second illustrative embodiment of the invention.

FIG. 4 is a flowchart of a second illustrative method for practicing the invention. The method begins at step 410 with the programming of configuration bits in a configuration memory (CRAM). This step is the same as that of step 310.

The configuration bits establish a specific circuit which may then be used at step 420 unchanged in that form for an extended time. The configuration bits can be reprogrammed as indicated at step 430.

In accordance with the second illustrative embodiment of the invention, if the user of the FPGA decides to reprogram the circuit, this is detected at step 430 by detecting a reprogram instruction; and the signal inputs to the transistors controlled by the bits of the CRAM are programmed low at step 475. One or more control bits such as Recover and EN_VSSR are set high at step 480. The gates of the transistors controlled by the configuration memory are then subjected at step 485 to a rejuvenating process. In this process, voltages are applied to all the gates of the pass transistors that are opposite in polarity to the high voltages of the configuration bits applied in step 420 and at approximately the same magnitude. These voltages are applied for a duration of at least one second and typically for several seconds which has been found to restore at least 80 percent or more of the original operating characteristics of the pass transistors. The control bits Recover and EN_VSSR are then reset to zero at step 490. This process is substantially the same as the process of steps 340-370.

After completion of the rejuvenating process, the new arrangement of configuration bits is used at step 410 to reconfigure the configuration memory with the new bit pattern. The process then returns to step 420.

Figure 5:
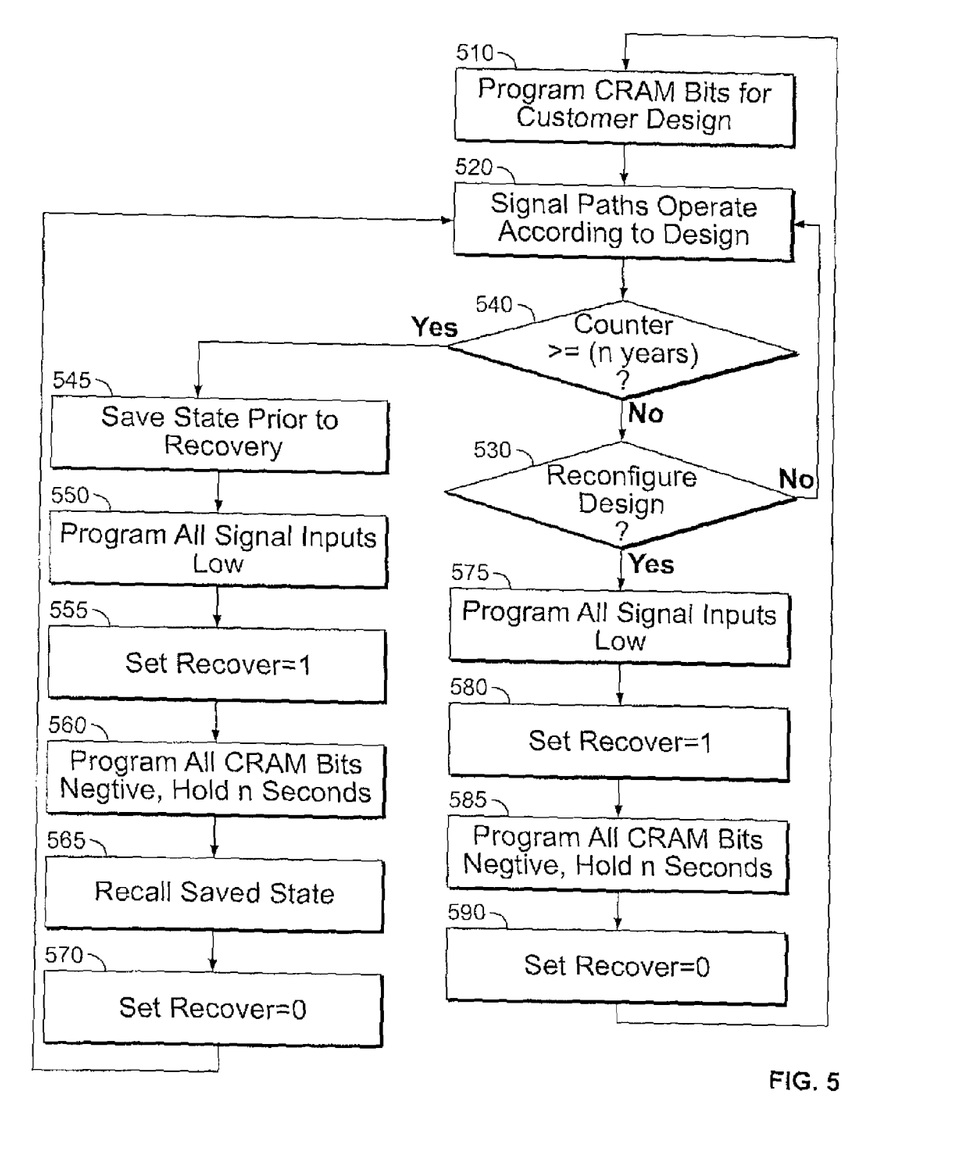
FIG. 5 is a flow chart of a third illustrative embodiment of the invention.

The methods of FIGS. 3 and 4 may also be combined as in FIG. 5. FIG. 5 is a flowchart of a third illustrative method for practicing the invention. The method begins at step 510 with the programming of the configuration bits in the CRAM. This step is substantially the same as steps 310 and 410.

In accordance with this embodiment of the invention, on a periodic basis and whenever the configuration memory is reconfigured, the aging process is reversed and the configuration bits are reset. To do this, step 530 determines if a user has decided to reconfigure the CRAM by detecting a reprogramming instruction. The CRAM is also monitored at step 540 to determine if the time elapsed from the last setting of the configuration bits has reached a predetermined duration. When step 540 determines that the predetermined duration has been reached, the state of the configuration memory is stored at step 545; and the signal inputs to the transistors controlled by the bits of the CRAM are programmed low at step 550. One or more control bits such as Recover and EN_VSSR are set high at step 555. The gates of the transistors controlled by the configuration memory are then subjected at step 560 to a rejuvenating process. In this process, voltages are applied to all the gates of the pass transistors that are opposite in polarity to the high voltages of the configuration bits applied in step 520 and at approximately the same magnitude. These voltages are applied for a duration of at least one second and typically for several seconds which has been found to restore at least 80 percent or more of the original operating characteristics of the pass transistors.

After completion of the rejuvenating process, the configuration bits that were stored are then used at step 565 to reconfigure the configuration memory with the same bit pattern that was used in step 510 to configure the memory. The control bits Recover and EN_VSSR are then reset to zero at step 570 and the process then returns to step 520 and resumes monitoring at steps 530 and 540 to determine if the user has decided to reconfigure the CRAM and if the time elapsed from the last setting of the configuration bits has reached a predetermined duration.

If an instruction has been received to reconfigure the configuration memory with a different arrangement of configuration bits, this is detected at step 530; and the signal inputs to the transistors controlled by the bits of the CRAM are programmed low at step 575. One or more control bits such as Recover and EN_VSSR are set high at step 580. The gates of the transistors controlled by the configuration memory are then subjected at step 585 to a rejuvenating process. In this process, voltages are applied to all the gates of the pass transistors that are opposite in polarity to the high voltages of the configuration bits applied in step 520 and at approximately the same magnitude. These voltages are applied for a duration of at least one second and typically for several seconds which has been found to restore at least 80 percent or more of the original operating characteristics of the pass transistors. The control bits are then reset to zero at step 590. This process is substantially the same as the process of steps 475-490.

After completion of the rejuvenating process, the new arrangement of configuration bits are used at step 510 to reconfigure the configuration memory with the new bit pattern. The process then returns to step 520.

Figure 6:
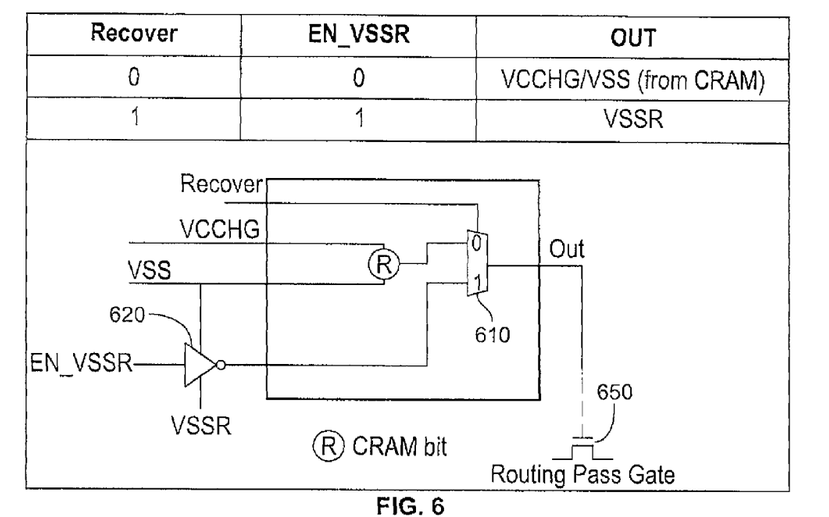
FIG. 6 is a schematic diagram of a first illustrative embodiment of a circuit useful in practicing the invention.

FIG. 6 depicts an illustrative embodiment of a control circuit 600 useful in controlling the high and low voltages applied to the gates of the pass transistors during normal operation of the CRAM and the reversing voltage used in the rejuvenating process. Circuit 600 comprises a multiplexer 610 and an inverter 620. FIG. 6 also depicts a pass gate transistor 650. Inputs to the circuit include the CRAM high rail VCCHG, the CRAM low rail VSS and the reversing voltage VSSR. Other inputs include the Recover and EN_VSSR signals and a configuration bit R. One input to mux 610 is the high rail voltage VCCHG or the low rail voltage VSS depending on whether the configuration bit R is high or low. A second input to mux 610 is the output of inverter 620. Inverter 620 provides an output VSS when EN_VSSR is 0 and an output VSSR when EN_VSSR is a 1. The Recover bit controls mux 610 to select VSS or VCCHG as the circuit output to pass gate transistor 650 when the Recover bit is a 0 and to select the output of the inverter as the circuit output when the Recover bit is a 1. Since EN_VSSR always has the same value as the Recover bit, the output of mux 610 is VSSR whenever the Recover bit is a 1. This operation is summarized in the truth table of FIG. 6.

Figure 7:
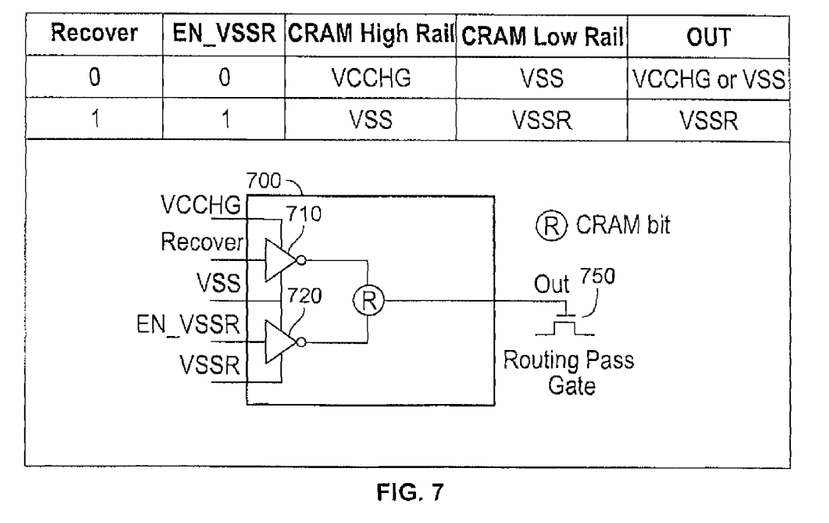
FIG. 7 is a schematic diagram of a second illustrative embodiment of a circuit useful in practicing the invention

FIG. 7 depicts an illustrative embodiment of a second control circuit 700 useful in controlling the high and low voltages applied to the gates of the pass transistors during normal operation of the CRAM and the reversing voltage used in the rejuvenating process. FIG. 7 also depicts a pass gate transistor 750. Circuit 700 comprises first and second inverters 710, 720. The output of circuit 700 to pass gate transistor 750 is the output of inverter 710 or the output of inverter 720 depending on whether the configuration bit R is high or low. During normal operation, R can be either a 1 or a 0. During the rejuvenating process, all the configuration bits R are set to a 0.

Inputs to the circuit include the CRAM high rail VCCHG, the CRAM low rail VSS and the reversing voltage VSSR. Other inputs include the Recover and EN_VSSR signals and a configuration bit R. The high rail voltage VCCHG and the low rail voltage VSS are the high and low power supplies to inverter 710; and VSS and VSSR are the high and low power supplies to second inverter 720. The output of inverter 710 is VCCHG when the Recover input to inverter 710 is a 0 and is VSS when the Recover input is a 1. The output of the inverter 720 is VSS when the EN_VSSR input to inverter 720 is a 0 and is VSSR when the EN_VSSR input is a 1. Thus, when the Recover and EN_VSSR bits are 0, the signal applied to the pass gate is the CRAM high rail VCCHG when the configuration bit R is 1 and it is the CRAM low rail VSS when the configuration bit R is a 0. When the Recover and EN_VSSR bits are a 1, the signal applied to the pass gate is the reversing voltage VSSR when the configuration bit R has been set to a 0. This operation is summarized in the truth table of FIG. 7.

As will be apparent to those skilled in the art, numerous variations may be practiced within the spirit and scope of the present invention. For example the order of execution of some of the steps set forth in FIGS. 3-5, may be changed. In particular, the order of execution of steps 530 and 540 may be exchanged. As indicated above, typical time periods for initiating the rejuvenation process at steps 340 and 540 are in the range from a few months to a few years. Some users may find it useful to initiate the rejuvenation process even more frequently. As also indicated above, typical durations for an effective rejuvenation pulse range from one second to several seconds. Pulses of longer duration may also be used; and shorter pulses may produce acceptable results in some circumstances.

What is claimed is:

1. A method for offsetting aging in a pass transistor comprising:
   a) setting, at a first time, configuration bits for controlling a plurality of gates of a plurality of pass transistors;
   b) testing whether a time elapsed since the first time exceeds a first predetermined time period;
   c) if the time elapsed exceeds the first predetermined time period, storing the configuration bits;
   d) applying to the plurality of gates of the pass transistors voltages that are opposite in polarity to voltages of the configuration bits, the voltages being applied for a second time period sufficient to remove at least 80 percent of the aging effects on the pass transistors; and
   e) after the second time period, using the stored configuration bits to reset the configuration bits for controlling the gates of the plurality of pass transistors.

2. The method of claim 1 further comprising returning to step b).

3. The method of claim 1 wherein the first predetermined time period is at least one month.

4. The method of claim 1 wherein the first predetermined time period is between one month and two years.

5. The method of claim 1 wherein the second time period is at least one second.

6. The method of claim 1 wherein the voltages that are opposite in polarity to the configuration bits have a magnitude that is approximately equal to the voltages of the configuration bits that are not zeroes.

7. A method for offsetting aging in a pass transistor comprising:
   a) setting a configuration memory comprising a plurality of configuration bits for controlling a plurality of gates of a plurality of pass transistors;
   b) detecting an instruction to reconfigure the configuration memory with a new configuration of configuration bits;
   c) applying to the plurality of gates of the pass transistors voltages that are equal in magnitude but opposite in polarity to voltages of the configuration bits, the voltages being applied for a time period sufficient to remove at least 80 percent of the aging effects on the pass transistors; and
   d) after the time period, setting the new configuration of configuration bits in the configuration memory.

8. The method of claim 7 further comprising returning to step b).

9. The method of claim 7 wherein the time period is at least one second.

10. The method of claim 7 wherein the voltages that are opposite in polarity to the configuration bits have a magnitude that is approximately equal to the voltages of the configuration bits that are not zeroes.

11. The method of claim 7 further comprising:
    testing whether a time elapsed since a new configuration of configuration bits was last set in the configuration memory exceeds a second predetermined time;
    if the time elapsed exceeds the second predetermined time period, storing the configuration bits;
    applying to the plurality of gates of the pass transistors voltages that are opposite in polarity to the voltages of the configuration bits, the voltages being applied for a third time period sufficient to remove at least 80 percent of the aging effects on the pass transistors; and
    after the third time period, using the stored configuration bits to reset the configuration bits for controlling the gates of the plurality of pass transistors.

12. A method for offsetting aging in a pass transistor comprising:
    a) setting, at a first time, configuration bits for controlling a plurality of gates of a plurality of pass transistors;
    b) testing whether a time elapsed since the first time exceeds a first predetermined time period;
    c) testing whether an instruction has been received to reconfigure the configuration bits;
    d) if the time elapsed exceeds the first predetermined time period, storing the configuration bits;
    e) applying to the plurality of gates of the pass transistors voltages that are opposite in polarity to voltages of the configuration bits, the voltages being applied for a second time period sufficient to remove at least 80 percent of the aging effects on the pass transistors;

f) after the second time period, using the stored configuration bits to reset the configuration bits for controlling the gates of the plurality of pass transistors;

g) if the instruction has been received to reconfigure the configuration bits, applying to the plurality of gates of the pass transistors voltages that are equal in magnitude but opposite in polarity to the voltages of the configuration bits, the voltages being applied for a third time period sufficient to remove at least 80 percent of the aging effects on the pass transistors; and h) after the third time period, setting a new configuration of configuration bits in configuration memory.

13. The method of claim 12 further comprising returning to step b).

14. The method of claim 12 wherein the first predetermined time period is at least one month.

15. The method of claim 12 wherein the first predetermined time period is between one month and two years.

16. The method of claim 12 wherein the second time period is at least one second.

17. The method of claim 12 wherein the voltages that are opposite in polarity to the configuration bits have a magnitude that is approximately equal to the voltages of the configuration bits that are not zeroes.

18. Apparatus for controlling a signal applied to a gate of a pass transistor in a circuit, said apparatus comprising:
   a multiplexer having first and second inputs, an output that is coupled to the gate of the pass transistor, and a control input for selecting one of the first and second inputs for the output, the first input being selected as the output of the multiplexer when the circuit is not in a recover mode and the second input being selected as the output when the circuit is in the recover mode;
   a selection circuit for selecting a high voltage rail or a low voltage rail depending on whether a configuration bit is high or low and providing the selected signal to the first input of the multiplexer; and
   an inverter having first and second power supply inputs, a signal input and an output that is coupled to the second input of the multiplexer, the signal input selecting for the output from the inverter a signal that is a function of one of the first and second power supply inputs.

19. Apparatus for controlling a signal applied to a gate of a pass transistor in a circuit, said apparatus comprising:
   a first inverter having first and second power supply inputs, a signal input and an output, the signal input selecting for the output a signal that is a function of one of the first and second power supply inputs, the first power supply input being selected as the output of the first inverter when the circuit is not in a recover mode and the second power supply input being selected as the output when the circuit is in the recover mode;
   a second inverter having third and fourth power supply inputs, a signal input and an output, the signal input selecting for the output a signal that is a function of one of the third and fourth power supply inputs, the third power supply input being selected as the output of the second inverter when the circuit is not in the recover mode and the fourth power supply input being selected as the output when the circuit is in the recover mode; and
   a selection circuit for selecting the output of the first inverter or the output of the second inverter depending on whether a configuration bit is high or low and providing the selected signal to the gate of the pass transistor.

20. The apparatus of claim 19 wherein the second and third power supply inputs are coupled together.

* * * * *